(12) United States Patent
Ban et al.

(10) Patent No.: US 11,353,982 B2
(45) Date of Patent: Jun. 7, 2022

(54) FEATURE RECOGNITION STRUCTURE, FABRICATING METHOD, DRIVING METHOD AND RELATED DEVICE

(71) Applicant: BOE Technology Group Co., Ltd., Beijing (CN)

(72) Inventors: Shengguang Ban, Beijing (CN); Zhanfeng Cao, Beijing (CN); Qi Yao, Beijing (CN); Yankai Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 606 days.

(21) Appl. No.: 16/339,226

(22) PCT Filed: Aug. 30, 2018

(86) PCT No.: PCT/CN2018/103146
§ 371 (c)(1),
(2) Date: Apr. 3, 2019

(87) PCT Pub. No.: WO2019/109680
PCT Pub. Date: Jun. 13, 2019

(65) Prior Publication Data
US 2020/0159381 A1    May 21, 2020

(30) Foreign Application Priority Data

Dec. 7, 2017    (CN) .................. 201711284087.X (51) Int. Cl.
*G06F 3/041* (2006.01)
*H01L 41/047* (2006.01)
(Continued)

(52) U.S. Cl.
CPC ........ *G06F 3/04144* (2019.05); *H01L 41/047* (2013.01); *H01L 41/1132* (2013.01);
(Continued)

(58) Field of Classification Search
CPC ....... G06F 3/04144; G06F 2203/04103; G06F 3/041; G06F 3/045; H01L 41/047; H01L 41/1132; H01L 41/187; H01L 41/29
See application file for complete search history.

(56) References Cited

U.S. PATENT DOCUMENTS

2016/0291729 A1    10/2016   Schardt et al.
2016/0306481 A1*   10/2016   Filiz ................. G01L 1/146
(Continued)

FOREIGN PATENT DOCUMENTS

CN    203480471 U    3/2014
CN    106557246 A    4/2017
(Continued)

OTHER PUBLICATIONS

First Office Action, including Search Report, for Chinese Patent Application No. 201711284087.X, dated May 7, 2020, 13 pages.
(Continued)

*Primary Examiner* — Pegeman Karimi
(74) *Attorney, Agent, or Firm* — Westman, Champlin & Koehler, P.A.

(57) ABSTRACT

A feature recognition structure provided by the embodiments of the present disclosure comprises: a plurality of first electrodes and a plurality of second electrodes disposed on a base substrate, wherein orthogonal projections of the plurality of first electrodes and of the plurality of second electrodes on the base substrate intersect each other to form a plurality of overlap regions; and a plurality of functional patterns disposed between one or more of the plurality of first electrodes and corresponding one or more of the plurality of second electrodes, wherein an orthogonal projection of each of the plurality of functional patterns on the base substrate is located in a corresponding one of the plurality of overlap regions; the functional patterns comprise at least one piezoelectric material, and have at least two types of sub- (Continued)

patterns, and different types of the sub-patterns have substantially different piezoelectric coefficients.

19 Claims, 6 Drawing Sheets

(51) Int. Cl.
    *H01L 41/113*    (2006.01)
    *H01L 41/187*    (2006.01)
    *H01L 41/29*     (2013.01)

(52) U.S. Cl.
    CPC ............ *H01L 41/187* (2013.01); *H01L 41/29* (2013.01); *G06F 2203/04103* (2013.01)

(56) References Cited

U.S. PATENT DOCUMENTS

| | | | | |
|---|---|---|---|---|
| 2018/0175826 | A1* | 6/2018 | Sadhu | H03H 9/564 |
| 2020/0018877 | A1* | 1/2020 | Zhou | G02F 1/13338 |
| 2020/0304098 | A1* | 9/2020 | Ito | H03H 9/0542 |

FOREIGN PATENT DOCUMENTS

| | | |
|---|---|---|
| CN | 106993094 A | 7/2017 |
| CN | 107316873 A | 11/2017 |
| CN | 206627934 U | 11/2017 |
| CN | 107422911 A | 12/2017 |
| CN | 110413335 A | 11/2019 |
| KR | 101790614 B1 | 10/2017 |

OTHER PUBLICATIONS

Extended European Search Report, for European Patent Application No. 18859957.5, dated Jul. 12, 2021, 8 pages.
International Search Report, for International Application No. PCT/CN2018/103146 dated Aug. 30, 2018, 4 pages.
Written Opinion, including English translation of Box V, for International Application No. PCT/CN2018/103146 dated Aug. 30, 2018, 8 pages.

* cited by examiner

FEATURE RECOGNITION STRUCTURE, FABRICATING METHOD, DRIVING METHOD AND RELATED DEVICE

CROSS-REFERENCE TO RELATED APPLICATION

The present application is the U.S. national phase of PCT Application No. PCT/CN2018/103146 filed on Aug. 30, 2018, which claims priority to Chinese patent application 201711284087.X filed on Dec. 7, 2017, the contents of which are incorporated herein by reference in their entireties.

TECHNICAL FIELD

Embodiments of the present disclosure relate to the field of touch recognition technology for display devices, in particular to a feature recognition structure, a fabricating method, a feature recognition device, and a driving method.

BACKGROUND

With the development of terminals, applications requiring touch recognition have become more and more popular. Commonly known touch recognition mainly includes fingerprint recognition and press instruction recognition.

A touch recognition structure of an existing terminal is unable to provide multi-level pressure recognition. That is, one touch recognition structure cannot be used to accurately recognize different levels of touch actions (e.g., touch and press). In the case of a current mobile terminal, a fingerprint recognition module and a press action recognition module are separate structures. For example, the fingerprint recognition module, such as the Home button of the mobile phone, is externally attached to a surface of the terminal, and can only provide fingerprint recognition. On the other hand, the press action recognition module is disposed on an inner side of the screen and can only recognize a press instruction.

It can be seen that different types of touch recognition structures cannot be integrated with each other, which is disadvantageous to the development of lightweight and miniaturized mobile terminals such as mobile phones.

SUMMARY

In a first aspect, embodiments of the present disclosure provide a feature recognition structure that includes:

a plurality of first electrodes and a plurality of second electrodes disposed on a base substrate, wherein orthogonal projections of the plurality of first electrodes and of the plurality of second electrodes on the base substrate intersect each other to form a plurality of overlap regions; and a plurality of functional patterns disposed between one or more of the plurality of first electrodes and corresponding one or more of the plurality of second electrodes, wherein an orthogonal projection of each of the plurality of functional patterns on the base substrate is located in a corresponding one of the plurality of overlap regions. The functional patterns include at least one piezoelectric material, and have at least two types of sub-patterns, and different types of the sub-patterns have substantially different piezoelectric coefficients.

According to some possible embodiments of the present disclosure, the functional patterns include at least one first type functional pattern and at least one second type functional pattern which is spaced apart from the at least one first type functional pattern, and at least one orthogonal projection of at least one of the first type functional patterns on the base substrate and at least one orthogonal projection of at least one of the second type functional patterns on the base substrate are located in a same overlap region.

According to some possible embodiments of the present disclosure, the functional patterns include at least one first type functional patterns and at least one second type functional patterns, and of two adjacent overlap regions, one includes only the orthogonal projection of the first type functional pattern on the base substrate, and the other includes only the orthogonal projection of the second type functional pattern on the base substrate.

According to some possible embodiments of the present disclosure, the first electrode extends in a first direction, and the plurality of the first electrodes is disposed in parallel with each other in a second direction. Of two adjacent overlap regions in the first direction, one includes only the orthogonal projection of the first type functional pattern on the base substrate, and the other includes only the orthogonal projection of the second type functional pattern on the base substrate.

According to some possible embodiments of the present disclosure, the at least one orthogonal projection of the at least one first type functional pattern on the base substrate and the at least one orthogonal projection of the at least one second type functional pattern on the base substrate fall within a same overlap region, but are separated from each other.

According to some possible embodiments of the present disclosure, the first type functional pattern includes zinc oxide (ZnO), and the second type functional pattern includes gallium nitride (GaN).

According to some possible embodiments of the present disclosure, the material of zinc oxide has a piezoelectric coefficient of 1.21 $C/m^2$, and the material of gallium nitride has a piezoelectric coefficient of 0.73 $C/m^2$.

According to some possible embodiments of the present disclosure, at least two adjacent first electrodes are connected in parallel with each other, and at least two adjacent second electrodes are connected in parallel with each other.

According to some possible embodiments of the present disclosure, a display region on the base substrate is divided into a plurality of independent detection sub-regions. In each of the detection sub-regions, the first electrodes are connected in parallel with each other, and the second electrodes are also connected in parallel with each other. Moreover, the first electrodes between different detection sub-regions are not electrically connected, and the second electrodes between the different detection sub-regions are not electrically connected, either.

In a second aspect, some embodiments of the present disclosure provide a method for fabricating a feature recognition structure, which method includes providing a base substrate; and forming a plurality of first touch electrodes, a plurality of piezoelectric patterns, and a plurality of second touch electrodes sequentially on the base substrate. Orthogonal projections of the plurality of first electrodes and of the plurality of second electrodes on the base substrate intersect each other to form a plurality of overlap regions. The plurality of functional patterns is disposed between one or more of the plurality of first electrodes and corresponding one or more of the plurality of second electrodes, and orthogonal projections of the plurality of functional patterns on the base substrate are located in the overlap regions. The functional patterns include at least one piezoelectric material, and have at least two types of sub-patterns, and different types of the sub-patterns have substantially different piezoelectric coefficients.

In a third aspect, some embodiments of the present disclosure further provide a feature recognition device that includes the feature recognition structure provided in the first aspect of the present disclosure. The feature recognition device further includes an input circuit configured to input a detection signal to the first electrodes; a reception circuit configured to receive an induced signal from the second electrodes; a storage circuit configured to store correspondences between pressure levels and touch recognition modes; a determination circuit configured to determine a pressure level of the induced signal; and a processing circuit configured to determine a touch recognition mode matching the induced signal from the correspondences between the pressure levels and the touch recognition modes based on the pressure level.

According to some possible embodiments of the present disclosure, the storage circuit further stores correspondences between the induced signals and the pressure levels. The determination circuit is specifically configured to determine the pressure level matching the induced signal from the correspondences between the induced signals and the pressure levels stored by the storage circuit based on an electrical parameter of the induced signal.

According to some possible embodiments of the present disclosure, the touch recognition mode includes a print recognition mode. The feature recognition device further includes a first execution circuit configured to extract, from the induced signal, a feature to be recognized for detecting a biological print when the processing circuit determines that the touch recognition mode matching the induced signal is the print recognition mode.

According to some possible embodiments of the present disclosure, the touch recognition mode includes a press instruction recognition mode. The feature recognition device further includes a second execution circuit, configured to output a press instruction corresponding to a press level of the induced signal when the processing circuit determines that the touch recognition mode matching the induced signal is the press instruction recognition mode.

In a fourth aspect, embodiments of the present disclosure further provide a driving method applied to the feature recognition structure as provided in the first aspect of the present disclosure, which method includes: inputting a detection signal to the first electrodes; receiving an induced signal from the second electrodes; determining a pressure level of the induced signal; and determining a touch recognition mode that matches the induced signal from pre-stored correspondences between pressure levels and touch recognition modes based on the pressure level of the induced signal.

According to some possible embodiments of the present disclosure, the determining the pressure level of the induced signal includes determining the pressure level that matches the induced signal from pre-stored correspondences between electrical parameters and the pressure levels based on an electrical parameter of the induced signal.

According to some possible embodiments of the present disclosure, the touch recognition mode includes a print recognition mode, and the driving method further includes extracting, from the induced signal, a feature to be recognized for detecting a biological print when the touch recognition mode that matches the induced signal is determined as the print recognition mode.

According to some possible embodiments of the present disclosure, the touch recognition mode includes a press instruction recognition mode, and the driving method further includes outputting a press instruction corresponding to a press level of the induced signal when the touch recognition mode that matches the induced signal is determined as the press instruction recognition mode.

In a fifth aspect, embodiments of the present disclosure further provide a display device that includes the feature recognition device provided in the third aspect of the present disclosure.

BRIEF DESCRIPTION OF THE DRAWINGS

In order to explain the technical solutions of the embodiments of the present disclosure more clearly, accompanying drawings necessary for the description of the embodiments of the present disclosure will be briefly described hereinafter. Obviously, the drawings in the following description merely represent some of the embodiments of the present disclosure, and based on these drawings, other drawings may be obtained by those skilled in the art without any inventive skill.

DETAILED DESCRIPTION

To make the technical problems to be solved, the technical solutions and the advantages of the present disclosure more apparent, the present disclosure will be described in detail hereinafter in conjunction with the drawings and the embodiments.

In the following description, specific details such as specific configurations and components are provided merely to facilitate a complete understanding of the embodiments of the present disclosure. Therefore, it will be apparent to those skilled in the art that various variations and modifications may be made to the embodiments described herein without departing from the scope and spirit of the present disclosure. In addition, the description of the well-known functions and configurations is omitted for clarity and conciseness.

It is to be understood that reference throughout the description about "one embodiment" or "an embodiment" means that one or more particular features, structures or characteristics related to the embodiment are included in at least one embodiment of the present disclosure. Therefore, the phrases "in one embodiment" or "in an embodiment" in various places throughout the description do not necessarily refer to the same embodiment. Furthermore, these particular features, structures or characteristics can be combined in one or more embodiments in any suitable manner.

The embodiments of the present disclosure provide the following solutions to the technical problem that the existing fingerprint recognition module as a separate structure is not highly integrated and tends to be interfered by the external environment.

Figure 1:
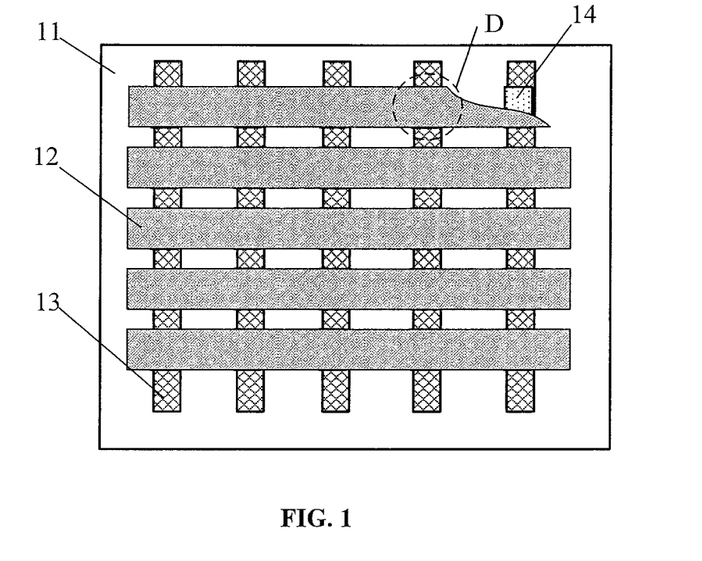
FIG. 1 is a schematic diagram showing a structure of a feature recognition structure as provided in an embodiment of the present disclosure.

In one aspect, an embodiment of the present disclosure provides a feature recognition structure. As shown in FIG. 1, the feature recognition structure includes a plurality of first electrodes 12 and a plurality of second electrodes 13 disposed on a base substrate 11. Orthogonal projections of the plurality of first electrodes 12 and of the plurality of second electrodes 13 on the base substrate 11 intersect one another to form a plurality of overlap regions D. The feature recognition structure further includes a plurality of functional patterns 14 disposed between the plurality of first electrodes 12 and the plurality of second electrodes 13, and orthogonal projections of the plurality of functional patterns 14 on the base substrate 11 are located in the plurality of overlap regions D respectively. Furthermore, each of the functional patterns 14 is connected to the first electrode 12 and the second electrode 13 whose orthogonal projections on the base substrate 11 are located in the same overlap region D as that of the functional pattern. Here, the expression that each of the functional patterns 14 is connected to the first electrode 12 and the second electrode 13 whose orthogonal projections on the base substrate 11 are located in the same overlap region D as that of the functional pattern generally means that the functional pattern 14 is electrically connected to the first electrode 12 and the second electrode 13 whose orthogonal projections on the base substrate 11 are located in the same overlap region D as that of the functional pattern. However, embodiments of the present disclosure are not limited to the electrical connection, but can be carried out with other connection means that are well-known in the art.

The functional patterns 14 of the present embodiment include at least one piezoelectric material, and have at least two types of sub-patterns, and different types of the sub-patterns have substantially different piezoelectric coefficients.

It will be understood that, as shown in FIG. 1, both the first electrode 12 and the second electrode 13 are elongated, and an extending direction of the first electrode 12 is at an angle with an extending direction of the second electrode 13. However, embodiments of the present disclosure are not limited thereto, and the first electrode 12 and the second electrode 13 may be also designed to have other suitable shapes as actually desired.

In this embodiment, the functional patterns having different piezoelectric coefficients are provided between the first electrodes and the second electrodes to constitute piezoelectric sensors having different piezoelectric effects, i.e., piezoelectric diode structures. The piezoelectric sensors having the different piezoelectric effects, which are distributed on the base substrate in the form of an array, can sense different levels of pressure. For example, a piezoelectric sensor having a larger piezoelectric coefficient is sensitive to pressure, while a piezoelectric sensor having a smaller piezoelectric coefficient is less sensitive to pressure. Based on such a difference in the sensing capability, the feature recognition structure provided in the embodiment of the present disclosure may recognize pressing forces at different pressure levels. In practical applications, it may recognize more levels of touch actions that a user makes. If it is applied to a terminal, the touch recognition structure of the terminal can be simplified, which is more advantageous in the development of the terminal towards miniaturization and light weight. Therefore, the feature recognition structure of the present disclosure has a very appealing practical value.

Below, the feature recognition structure of this embodiment will be described in detail.

As an exemplary illustration, the functional patterns of the present embodiment include at least one first type functional pattern and at least one second type functional pattern which is spaced apart from the at least one first type functional pattern. The first type functional pattern and the second type functional pattern are different in their types, that is, they have different piezoelectric coefficients. In addition, optionally, the first and second type functional patterns may be fabricated on the same layer. Accordingly, the process of fabricating on the same layer may effectively reduce a step difference between an upper film layer and a lower film layer, and can further improve the stability of the process.

Figure 2:
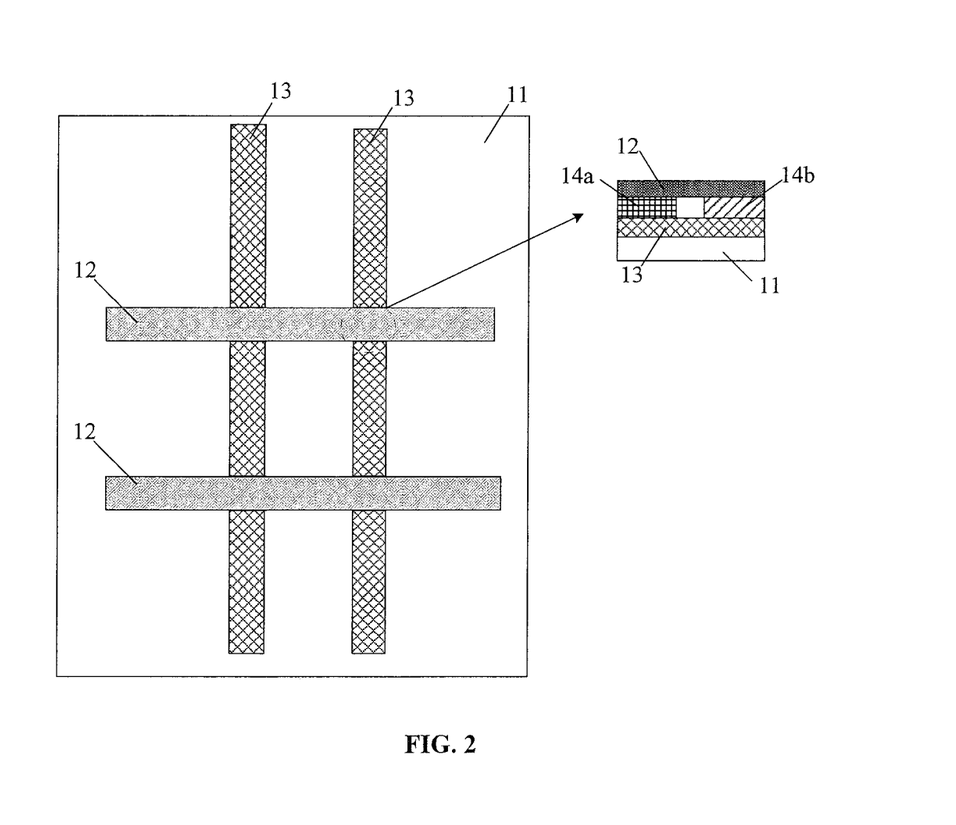
FIG. 2 is a schematic diagram showing a structure of one implementation of the feature recognition structure provided in the embodiment of the present disclosure.

As one possible embodiment, as shown in FIG. 2, at least one orthogonal projection of at least one of the first type functional patterns 14a on the base substrate and at least one orthogonal projection of at least one of the second type functional patterns 14b on the base substrate are located in a same overlap region. In other words, one piezoelectric sensor contains two types of sub-patterns having different piezoelectric coefficients. Optionally, the at least one orthogonal projection of the at least one first type functional pattern on the base substrate and the at least one orthogonal projection of the at least one second type functional pattern on the base substrate fall within the same overlap region, but are separated from each other. Alternatively, a combination of the at least one orthogonal projection of the at least one first type functional pattern on the base substrate and the at least one orthogonal projection of the at least one second type functional pattern on the base substrate may exactly coincides with the same overlap region.

Figure 3:
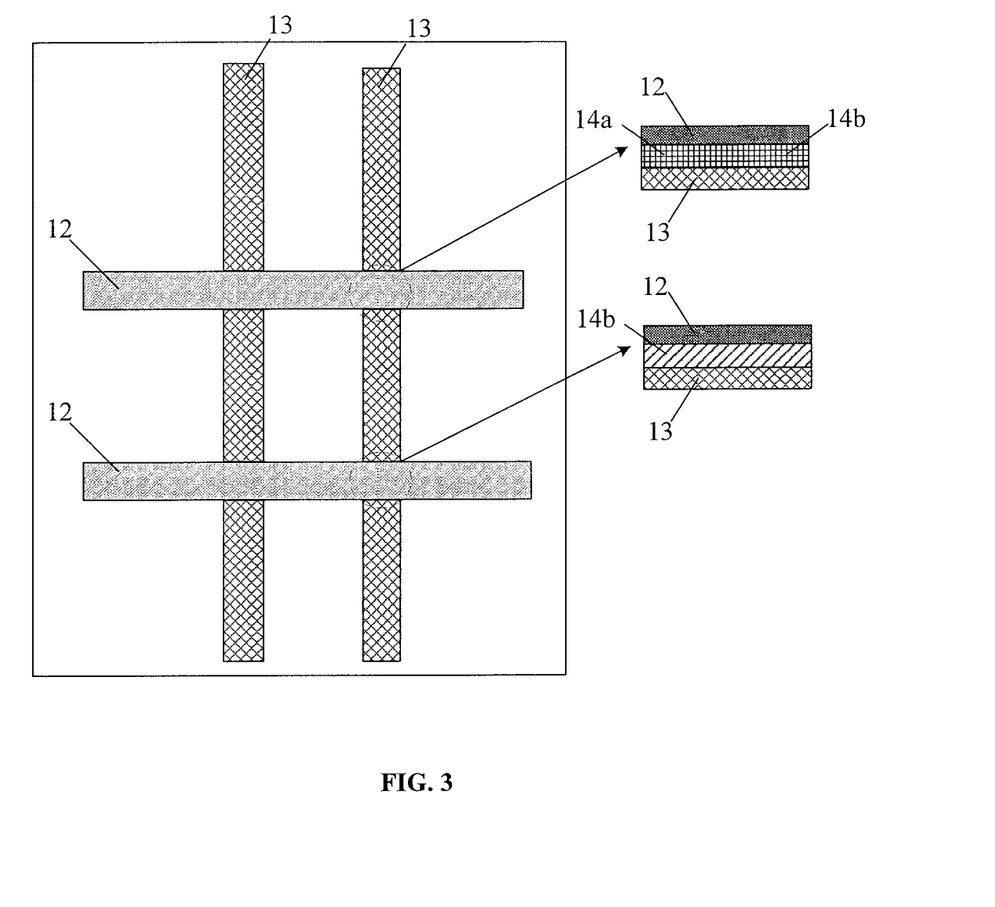
FIG. 3 is a schematic diagram showing a structure of another implementation of the feature recognition structure provided in the embodiment of the present disclosure.

As another possible embodiment, of two adjacent overlap regions, one includes only the orthogonal projection of the first type functional pattern on the base substrate, and the other includes only the orthogonal projection of the second type functional pattern on the base substrate. In other words, one piezoelectric sensor contains only one type of sub-pattern, and such a design can reduce the difficulty in the fabrication and a crosstalk phenomenon of piezoelectric signals in the piezoelectric sensor. For example, in the embodiment as shown in FIG. 3, the plurality of first electrodes 12 is disposed in parallel with each other, and extends in a first direction (shown as a row direction in FIG. 3, but not limited to the row direction), and the plurality of second electrodes 13 is disposed in parallel with each other in the first direction and extends in a second direction (shown as a column direction in FIG. 3, but not limited to the column direction). In the first direction, two adjacent overlap regions include only the orthogonal projections of the first type functional patterns 14a on the base substrate 11, or only the orthogonal projections of the second type functional patterns 14b on the base substrate 11. In the second direction, of two adjacent overlap regions, one includes only the orthogonal projection of the first type functional pattern 14a on the base substrate 11, and the other includes only the orthogonal projection of the second type functional pattern 14b on the base substrate 11.

Herein, FIG. 2 merely shows a situation where the functional patterns of the present embodiment include the first type functional patterns 14a and the second type functional patterns 14b which differ from the first type functional patterns 14a in the type, that is, they have different piezoelectric coefficients. Naturally, as actually desired, for example, when further subdivision of a touch or press action is required, the functional patterns may further include, for example, at least one third type functional patterns 14c or at least one fourth type functional patterns 14d, in addition to the first type functional patterns 14a and the second type functional patterns 14b. Herein, the functional patterns of each type of the first type functional patterns 14a, the second type functional patterns 14b, the third type functional patterns 14c or the fourth type functional patterns 14d may be connected in series or in parallel with each other, and integrated use of signals of three or more piezoelectric materials can thus be realized by sensing corresponding currents, so as to allow for a multi-level piezoelectric control.

In practical applications, in terms of material, the first type functional pattern of the present embodiment includes zinc oxide (ZnO), and the second type functional pattern includes gallium nitride (GaN). Among them, the material of zinc oxide has a piezoelectric coefficient of 1.21 $C/m^2$, and the material of gallium nitride has a piezoelectric coefficient of 0.73 $C/m^2$. When a smaller pressure is applied, it can be considered that only the material having a relatively large piezoelectric coefficient, such as zinc oxide, can rapidly generate induced charges and thus a signal. When the pressure is further increased, the piezoelectric material having a relatively small piezoelectric coefficient, such as gallium nitride, can be further excited to generate a piezoelectric signal. Such a two-level piezoelectric control can be provided by the integrated use of the signals of the two piezoelectric materials. Naturally, based on the above contents of the embodiment of the present disclosure, it will be apparent to those skilled in the art that the multi-level piezoelectric control can also be provided by the integrated use of the signals of three or more piezoelectric materials.

In addition, on the basis of the above, in the feature recognition structure of the embodiment, at least two adjacent first electrodes 12 are connected in parallel with each other, and at least two adjacent second electrodes 13 are connected in parallel with each other, in order to further provide the accuracy of piezoelectric induction.

Based on such a structural design, piezoelectric signals generated by the functional patterns 14 which are connected in parallel with each other through the first electrodes and the second electrodes can be superimposed, thereby providing a signal amplification effect.

As an exemplary illustration, in practical applications, if the feature recognition structure of the embodiment is applied to a mobile terminal such as a mobile phone or a tablet computer, a corresponding display region on the base substrate may be divided into a plurality of independent detection sub-regions. In each of the detection sub-regions, the first electrodes 12 are connected in parallel with each other, and the second electrodes 13 are also connected in parallel with each other. Further, the first electrodes 12 between different detection sub-regions are not electrically connected. Similarly, the second electrodes 13 between the different detection sub-regions are not electrically connected.

Obviously, based on such a structural design, the embodiment is capable of detecting a touch operation by using the detection sub-regions as recognition granularity. Accordingly, the embodiment can provide the improved recognition granularity, thereby further improving the sensitivity of recognition.

The feature recognition structure of the present embodiment has been illustrated above, and is not limited to those described in the embodiments of the present disclosure. It should be understood that the functional patterns of the present embodiment are not limited to two types, and the materials are not limited to zinc oxide and gallium nitride and may further include, for example, a ceramic material having the piezoelectric effect.

In another aspect, as shown in FIGS. 1 to 3, an embodiment of the present disclosure further provides a method for fabricating the feature recognition structure as described above. The method includes providing a base substrate 11; and forming a plurality of first touch electrodes 12, a plurality of piezoelectric patterns 14 and a plurality of second touch electrodes 13 sequentially on the base substrate 11. Orthogonal projections of the plurality of first electrodes 12 and of the plurality of second electrodes 13 on the base substrate 11 intersect each other to form a plurality of overlap regions D. The plurality of functional patterns 14 is disposed between the plurality of first electrodes 12 and the plurality of second electrodes 13, and orthogonal projections of the plurality of functional patterns 14 on the base substrate 11 are located in the overlap regions D. The functional patterns 14 include at least one piezoelectric material, and have at least two types of sub-patterns, and different types of the sub-patterns have substantially different piezoelectric coefficients.

Obviously, the fabricating method of this embodiment is used to fabricate the feature recognition structure as provided above in the present disclosure. Therefore, the fabricating method of this embodiment can also achieve the technical effects that the feature recognition structure can achieve.

The fabricating process of the feature recognition structure of the present embodiment will be described in detail below in combination with a practical application.

In the present application, as shown in FIG. 2, the functional pattern of the fabricated feature recognition structure include a first type functional pattern 14a and a second type functional pattern 14b, and the corresponding fabricating process includes the following steps.

In step S1, a second electrode material is deposited on a base substrate 11 and patterned by a single patterning process to obtain the second electrode 13 formed of the second electrode material.

In practical applications, the second electrode material may be a conductive metal, such as copper, silver or the like.

In step S2, zinc oxide nanorods are deposited on the base substrate 11 and formed into the first type functional patterns 14a by a single patterning process. Specifically, the step S2 includes providing a ZnO seed layer on the base substrate 11; weighing and dissolving certain amounts of HMT (hexamethylenetetramine) and $Zn(NO_3)_2 \cdot 6H_2O$ separately in deionized water so that concentrations of both reagents HMT and $Zn(NO_3)_2 \cdot 6H_2O$ are each 0.01 M/L, and then mixing these two solutions to obtain a mixed solution of HMT and $Zn(NO_3)_2 \cdot 6H_2O$; and soaking the ZnO seed layer with the mixed solution of HMT and $Zn(NO_3)_2 \cdot 6H_2O$, and heating the base substrate under vacuum (at a heating temperature between 140° C. and 160° C., preferably at 150° C.) until the seed layer forms single crystal ZnO nanorods.

The ZnO nanorods are patterned by a single patterning process to obtain the first type functional patterns 14a. To ensure stable piezoelectric properties, the first type functional patterns 14a may preferably have a thickness in the range of 5,000 angstroms to 15,000 angstroms.

In step S3, GaN is then deposited on the base substrate 11 and formed into the second type functional patterns 14b by a single patterning process. To ensure the stable piezoelectric properties, the second type functional patterns 14b may preferably have a thickness in the range of 5,000 angstroms to 15,000 angstroms.

It should be noted here that etching solutions for both ZnO and GaN are acidic, that is, under the action of an acidic etching solution, ZnO and GaN have a very close etching selectivity. Therefore, as an alternative, the material of GaN may be patterned by dry etching in this step.

In step S4, a layer of an insulating material is deposited to form an insulating layer, and the insulating layer is then etched to form via holes, through which the first type functional patterns 14a and the second type functional patterns 14b are exposed. The insulating material deposited in this step is used to improve the coverage of second electrodes which are subsequently formed. In practical applications, the insulating material may be SiN, and its thickness is preferably in the range of 100 angstroms to 500 angstroms.

In step S5, a first electrode material is deposited on the base substrate and patterned by a single patterning process to obtain the first electrodes 12 made of the first electrode material. In practical applications, the first electrode material may be a conductive metal, such as copper, silver or the like. Furthermore, the first electrode 12 is connected to the first type functional pattern 14a and the second type functional pattern 14b through the via holes in the insulating layer.

As a non-limiting example, as shown in FIG. 2, the first type functional patterns 14a and the second type functional patterns 14b are disposed on the same layer, and the first electrodes 12 are connected to the first type functional patterns 14a and the second type functional patterns 14b through a plurality of the via holes (not shown in FIG. 2) in the insulating layer.

Based on the above steps S1 to S5, piezoelectric sensors having two piezoelectric effects, which are composed of zinc oxide and gallium nitride, respectively, can be fabricated. Zinc oxide is a single crystal zinc oxide nanorod, and due to its one-dimensional structure, piezoelectric charges can be generated in only one direction, which is advantageous for charge accumulation. In addition, by adopting the single crystal structure, zinc oxide also makes internal defects thereof less and the generated piezoelectric charges not trapped by the defects during the transfer, and is thus more advantageous to the transferring of the piezoelectric charges to the second electrode.

Figure 4:
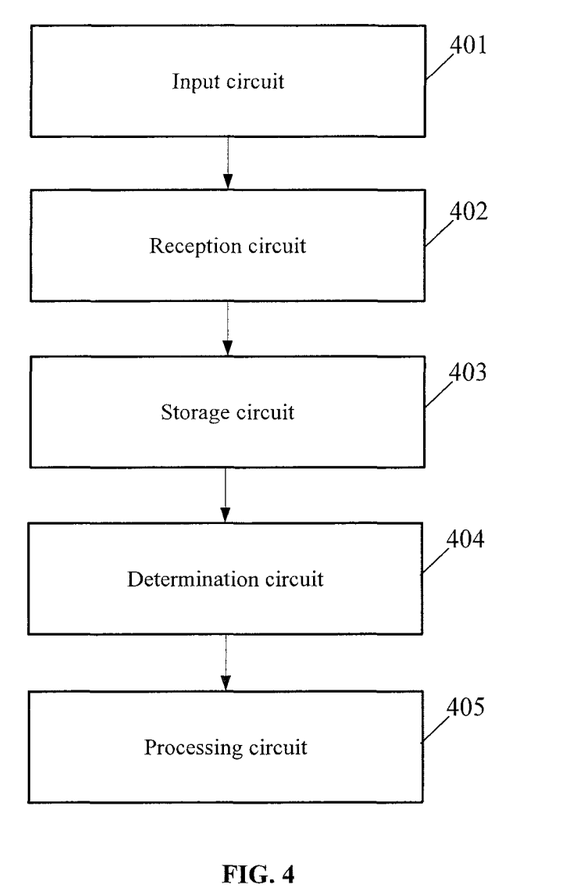
FIG. 4 is a schematic diagram illustrating a logical structure of a feature recognition device provided in an embodiment of the present disclosure.

In a further aspect, another embodiment of the present disclosure further provides a feature recognition device that includes the feature recognition structure provided in the above embodiment. Further, as shown in FIG. 4, the feature recognition device of the present embodiment further includes: an input circuit 401 configured to input a detection signal to the first electrodes; a reception circuit 402 configured to receive an induced signal from the second electrodes; a storage circuit 403 configured to store correspondences between pressure levels and touch recognition modes; a determination circuit 404 configured to determine a pressure level of the induced signal; and a processing circuit 405 configured to determine a touch recognition mode that matches the induced signal from the correspondences between the pressure levels and the touch recognition modes stored by the storage circuit based on the pressure level.

By way of example, the touch recognition mode of the present embodiment includes a print recognition mode and a press instruction recognition mode.

In combination with a user's actual use requirements, the feature recognition device will be touched when performing each of the print recognition and the press instruction recognition. But there is a difference that in the print recognition mode, the user only needs to touch lightly (with a small pressing force) since a heavy touch will deform a biological print, and reduce the recognition precision. In the press instruction recognition mode, a heavy touch (with a large pressing force) can be made.

Therefore, the pressure level corresponding to the print recognition mode is different from that corresponding to the press instruction recognition mode in the present embodiment. The print recognition mode will be performed when it is determined based on the pressure level that the user touches the feature recognition device with a smaller pressing force, and the press instruction recognition mode may be performed when it is determined based on the pressure level that the user touches the feature recognition device with a larger pressing force. Specifically, when it is determined based on the pressure level that the user touches the feature recognition device with a smaller pressing force to cause the print recognition mode to be performed, only print recognition will be performed, and no fingerprint will be collected. The collection of the fingerprint will be performed only when it is determined based on the pressure level that the user touches the feature recognition device with a larger pressing force to cause the press instruction recognition mode to be performed and a system requirement instruction, such as an instruction to instruct that valleys and ridges of the fingerprint need to be recognized, is received. Accordingly, based on the above setting, it is possible to effectively reduce unnecessary power consumption of the system due to frequent collection operations of the fingerprint. For example, the press instruction recognition mode may be performed for a press operation when performing payment or decoding on a terminal device.

It can be seen that the feature recognition device of the present embodiment is able to provide the print recognition and the press instruction recognition without conflict.

In the present embodiment, the storage circuit 403 further stores correspondences between the induced signals and the pressure levels, the determination circuit 404 is specifically configured to determine a pressure level that matches the induced signal from the correspondences between the induced signals and the pressure levels stored by the storage circuit 403 based on an electrical parameter of the induced signal.

In the present embodiment, the feature to be recognized may be a magnitude of pressure, and the storage circuit 403 stores the correspondences between the induced signals and the pressure levels and between the pressure levels and the touch recognition modes.

As a non-limiting example, the correspondences between the induced signals and the pressure levels may include three tables 1, 2 and 3.

Table 1 shows correspondences between pressures $N_1$ received by the first piezoelectric material contained in the first functional patterns of the plurality functional patterns and induced currents $I_1$ that the first piezoelectric material may generate.

Table 2 shows correspondences between pressures $N_2$ received by the second piezoelectric material contained in the second functional patterns of the plurality functional patterns and induced current $I_2$ that the second piezoelectric material may generate.

Table 3 shows correspondences between pressures N received by the first piezoelectric material and the second piezoelectric material simultaneously and induced currents I ($I_1+I_2$) they may generate.

Pressures in a certain range may be classified as belonging to a same pressure level, different pressure levels may correspond to different ranges of pressure, and different pressure levels may further correspond to different touch recognition modes.

As a non-limiting example, the determination circuit 404 of the present embodiment is specifically configured to look up the tables 1, 2 and 3 sequentially, obtain a current value closest to a currently-induced current and a corresponding pressure value from the table 1 and determine that a current pressing force belongs to a press level $L_1$ if the first type functional pattern generates a detectable induced current and the second type functional pattern generates an excessively weak induced current which is almost negligible, when a user's finger presses the feature recognition device with a small pressing force.

In addition, when the user's finger presses the feature recognition device with a large pressing force, both the first type functional pattern and the second type functional pattern can generate detectable induced currents. At this time, the determination circuit 404 may obtain a current value closest to the currently-induced current from the table 3 and a corresponding pressure value and determine that the current pressing force belongs to a pressure level $L_2$.

It can be understood based on the above principle that the present embodiment can realize further subdivision of the pressure level according to the magnitudes of the pressing forces.

Assuming that the feature recognition device of the present embodiment is applied to a mobile terminal, if the pressure level is detected as $L_1$, which indicates that the user touches the screen of the terminal with a small force, a touch sliding recognition will be normally performed, in which an operation such as sliding to be unlocked or sliding a page is recognized. If the pressure level is detected as $L_2$, the print recognition mode will be performed. In addition, if the pressure level is detected as $L_3$, the press instruction recognition mode will be performed.

On the basis of the above, the feature recognition device of the present embodiment further includes a first execution circuit which is configured to extract, from the induced signal, a feature to be recognized for detecting a biological print when the processing circuit 405 determines that the touch recognition mode that matches the induced signal is the print recognition mode.

In practical applications, the first execution circuit may be used to verify the legality of the biological print. That is, the feature recognition structure of the present embodiment can be applied to a user terminal. The user terminal locally stores recognition features corresponding to legal biological prints. When the user performs a press operation, pressing forces between locations of valleys and ridges of the biological print are different, which may cause piezoelectric diodes at corresponding positions to generate induced signals having marking functions. The first execution circuit of the present embodiment obtains the feature to be recognized from the induced signal, and compares it with the legal recognition feature stored locally in the user terminal, thereby verifying the legality of the user's identity.

Additionally, based on the above, the feature recognition device of the present embodiment may further include a second execution circuit which is configured to output a press instruction corresponding to the pressure level of the induced signal when the processing circuit 405 determines that the touch recognition mode that matches the induced signal is the press instruction recognition mode.

In practical applications, the second execution circuit can be used to output press instructions at different pressure levels, that is, the feature recognition structure of the present embodiment can be applied to a user terminal. The user terminal locally stores correspondences between pressure levels and press instructions, and different pressure levels may correspond to different press instructions. When the user performs a press operation, the determination circuit 404 of the present embodiment determines a matched pressure level based on a generated induced signal, and the second execution circuit can output a corresponding press instruction based on the matched pressure level. Taking a touch screen as the user terminal for example, the output of different press instructions may cause the user terminal to generate different menu commands, and the feature recognition structure of the present embodiment may enable the user terminal to implement a greater variety of press operations.

Figure 5:
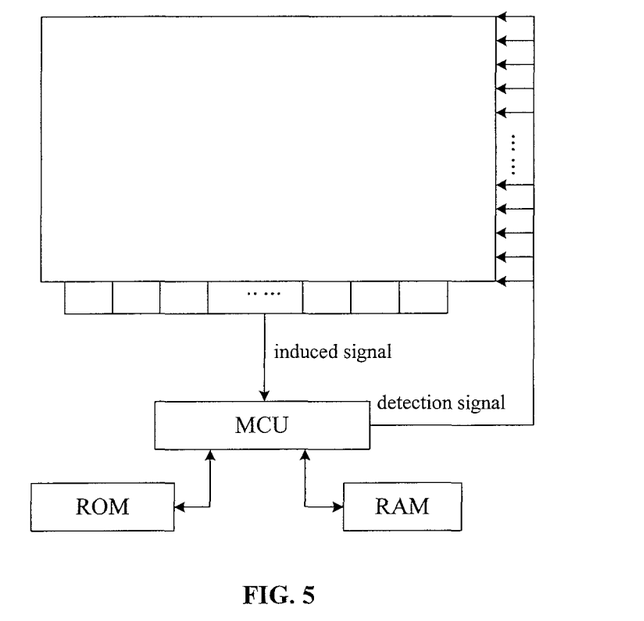
FIG. 5 is a schematic diagram illustrating an actual structure of the feature recognition device provided in an embodiment of the present disclosure.

Further, as shown in FIG. 5, the feature recognition device of the present embodiment may be implemented by a specific hardware, a microcontroller (MCU) with a computing function, and is equipped with a random-access memory (RAM) and a read-only memory (ROM). The MCU can output a detection signal to the first electrodes by row and read an induced signal fed back by the second electrodes. The RAM serves as a computing memory, and stores a result of a temporary induced signal for comparison by the MCU. The ROM is the storage circuit 403 as described above for storing all the correspondences as described above.

During the operation, the MCU reads the induced signal fed back by the second electrodes, which may be stored in the RAM, and retrieves data from the RAM and compares it with the correspondences in the ROM, so as to further determine a pressure level of the induced signal, a touch recognition mode corresponding to the pressure level and a corresponding feature to be recognized in the touch recognition mode.

Figure 6:
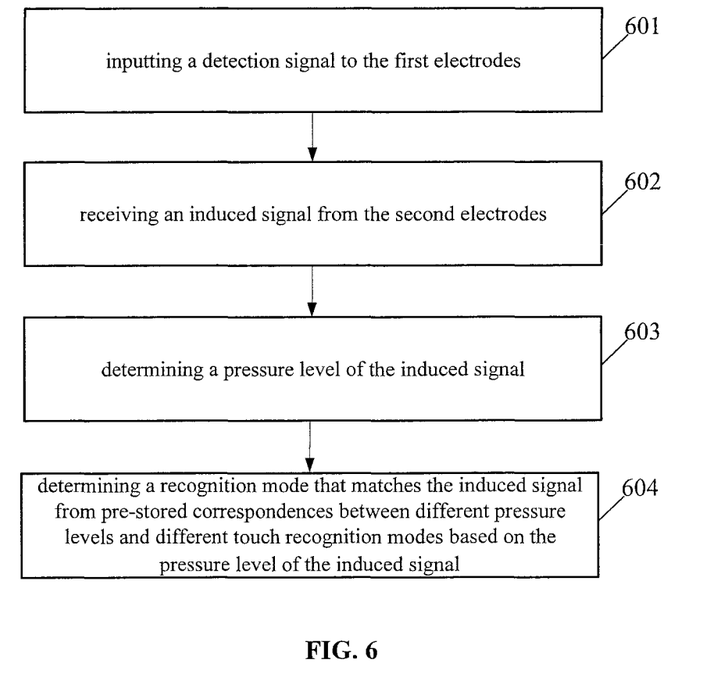
FIG. 6 is a schematic diagram illustrating steps of a driving method provided in an embodiment of the present disclosure.

Furthermore, an embodiment of the present disclosure provides a driving method that is applied to the feature recognition structure as provided above in the present disclosure. As shown in FIG. 6, the driving method includes a step 601 of inputting a detection signal to the first electrodes, a step 602 of receiving an induced signal from the second electrodes, a step 603 of determining a pressure level of the induced signal, and a step 604 of determining a touch recognition mode that matches the induced signal from the pre-stored correspondences between the pressure levels and the touch recognition modes based on the pressure level of the induced signal.

Obviously, the driving method of the present embodiment corresponds to the display device provided by the above embodiments, and therefore the driving method of the present embodiment can achieve the technical effects that the display device can achieve.

When performing the step 603 in the present embodiment, a pressure level that matches the induced signal is determined from pre-stored correspondences between electrical parameters and pressure levels based on an electrical parameter of the induced signal.

Optionally, on the basis of the above, the touch recognition mode includes a print recognition mode, and the driving method in the present embodiment further includes extracting, from the induced signal, a feature to be recognized for detecting a biological print (the feature to be recognized may be an electrical parameter that can represent the biological fingerprint, and this can be implemented by those skilled in the art based on related technology) when the touch recognition mode that matches the induced signal is determined as the print recognition mode.

In practical applications, the driving method of the present embodiment may be used to verify the legality of the biological print. That is, the driving method of the present embodiment can be applied to a user terminal. The user terminal locally stores recognition features corresponding to legal biological prints. When the user performs a press operation, pressing forces between locations of valleys and ridges of the biological print are different, which may cause piezoelectric diodes at corresponding positions to generate induced signals having marking functions. The driving method of the present embodiment can obtain the feature to be recognized from the induced signal, and compare it with the legal recognition feature stored locally in the user terminal, thereby verifying the legality of the user's identity.

Optionally, on the basis of the above, the touch recognition mode includes a press instruction recognition mode, and the driving method of the embodiment further includes outputting a press instruction corresponding to a press level of the induced signal when the touch recognition mode that matches the induced signal is determined as the press instruction recognition mode.

In practical applications, the driving method of the present embodiment can be used to output press instructions at different pressure levels, that is, the driving method of the present embodiment can be applied to a user terminal. The user terminal locally stores correspondences between pressure levels and press instructions, and different pressure levels may correspond to different press instructions. When the user performs a press operation, the driving method of the present embodiment determines a matched pressure level based on a generated induced signal, and then outputs a corresponding press instruction based on the matched pressure level. Taking a touch screen as the user terminal for example, the output of different press instructions may cause the user terminal to generate different menu commands, and the driving method of the present embodiment may enable the user terminal to implement a greater variety of press operations.

The process of the driving method of the present embodiment will be described in detail below in combination with an actual application.

Figure 7:
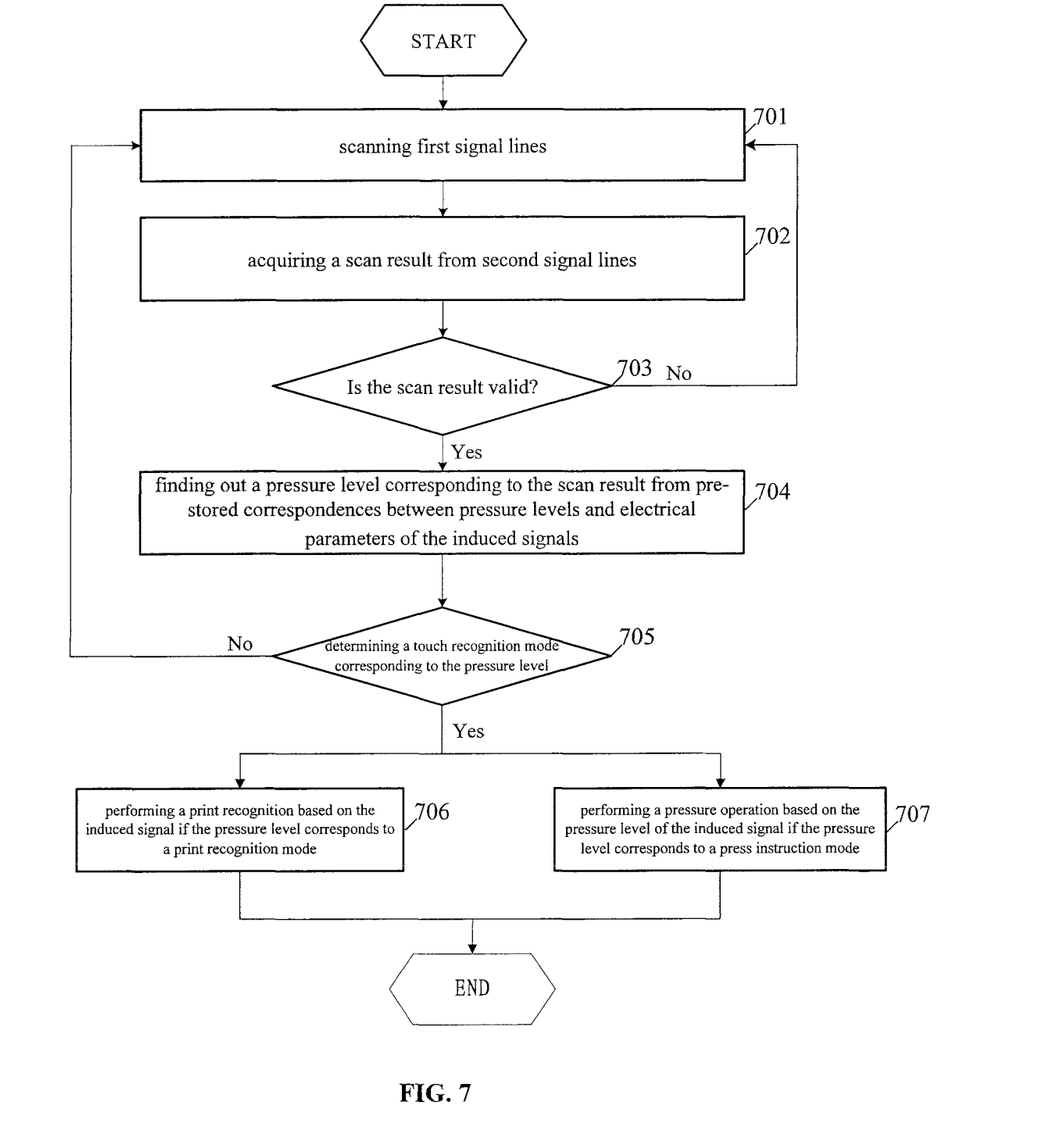
FIG. 7 is a flow chart of the driving method provided in the embodiment of the present disclosure in an actual application.

As a non-limiting example, as shown in FIG. 7, the process of the driving method of the present embodiment may include:

Step 701: Scanning first signal lines, i.e., loading a detection signal to the first signal lines row by row;

Step 702: acquiring a scan result from second signal lines, the scan result being an induced signal;

Step 703: determining whether the scan result is valid; for example, determining whether the scan result is greater than a valid threshold; if not ("NO" in step 703), then returning to step 701; otherwise (YES in step 704), performing step 704; for example, if the user touches the screen lightly, it indicates that the user normally slides on the operation screen, and the valid threshold can be used to filter the user's sliding operation;

Step 704: finding out a pressure level corresponding to the scan result from pre-stored correspondences between pressure levels and electrical parameters of induced signals;

Step 705: determining a touch recognition mode corresponding to the pressure level, and returning to step 701 if there is no corresponding touch recognition mode (NO in step 705); otherwise (YES in step 705), performing step 706 or Step 707;

Step 706: performing print recognition based on the induced signal if the pressure level corresponds to the print recognition mode; for example, comparing the acquired induced signal with induced signals corresponding to legal biological prints which has been recorded and stored in advance, and determining whether the verification is successful based on the comparison result; and Step 707: performing a corresponding pressure operation based on the pressure of the induced signal if the pressure level corresponds to the press recognition mode.

For example, a press instruction that matches the induced signal is determined and output from pre-stored correspondences between pressure levels and press instructions based on the pressure level of the acquired induced signal.

Furthermore, another embodiment of the present disclosure further provides a display device including the above feature recognition device provided by the embodiments of the present disclosure.

It can be seen that the display device of the present embodiment can realize the recognition of the print and the press instruction based on the feature recognition device provided by the embodiments of the present disclosure. This means that in practical applications, the feature recognition device of the display device of the present embodiment can be regarded as an integration of a print recognition device and a press instruction recognition device of a conventional terminal, and is highly integrated in structure. Therefore, an actual product will be lighter and smaller than corresponding products which are now on the market.

In addition, in a practical application, the feature recognition device provided by the present embodiment of the present disclosure may be disposed on, for example, a light-exiting side of a display screen (which may completely cover the entire screen region, or cover a part of the screen region), and covered by a flexible protective layer, so that the user can perform a touch operation directly on the protective layer.

The solutions of the present embodiments provide the recognition of the fingerprint of the user by means of pressing, and the print recognition tends not to be interfered by the external environment as compared with the related art. For example, when there is water remaining on the screen, the fingerprint can still be recognized by means of pressing, which has a high practical value for the user.

Further, in order not to affect the aperture ratio of the display device, the above-described base substrate of the present embodiments also serves as a base substrate on the light-exiting side of the display device that includes a plurality of pixel regions. The orthogonal projections of the first touch electrodes, the second touch electrodes, and the functional patterns on the base substrate are all located in gaps between orthogonal projections of the plurality of pixel regions on the base substrate. In other words, the first touch electrodes, the second touch electrodes, and the functional patterns of the present embodiments are all formed in the regions of the gaps between the pixel regions. In the existing display device, the gap regions are provided with a black matrix for shielding. Therefore, based on the above design, the first touch electrodes, the second touch electrodes, and the functional patterns of the present embodiments will not affect the original aperture ratio of the display device.

Figure 8:
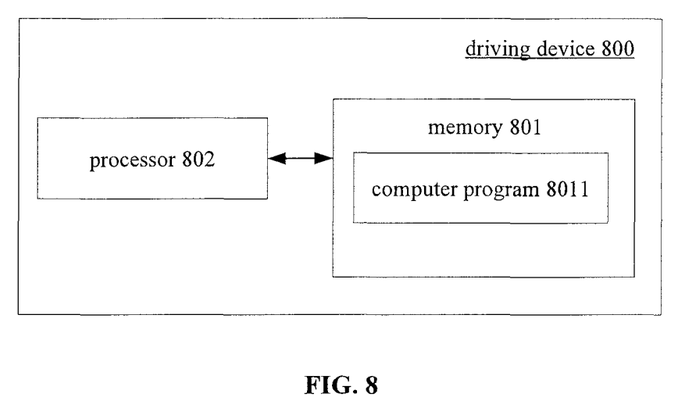
FIG. 8 is a schematic diagram illustrating an actual structure of a driving device provided in an embodiment of the present disclosure.

In addition, an embodiment of the present disclosure further provides a driving device that includes the above-mentioned feature recognition device provided by the embodiments of the present disclosure. As shown in FIG. 8, the driving device 800 includes, for example, a memory 801, a processor 802, and a computer program 8011 that is stored on the memory 801 and executable on the processor 802. When the computer program 8011 is executed by the processor, the following steps are implemented: inputting a detection signal to the first electrodes; receiving an induced signal from the second electrodes; determining a pressure level of the induced signal; and determining a touch recognition mode that matches the induced signal from pre-stored correspondences between pressure levels and touch recognition modes based on the pressure level of the induced signal.

Optionally, in the present embodiment, the step of executing, by the processor 802, the computer program 8011 to determine the pressure level of the induced signal includes: determining the pressure level that matches the induced signal from pre-stored correspondences between electrical parameters and the pressure levels based on an electrical parameter of the induced signal.

Optionally, the touch recognition mode includes a print recognition mode. When the processor 802 of the present embodiment executes the computer program 8011, the following steps may be implemented: extracting, from the induced signal, a feature to be recognized for detecting a biological print when the touch recognition mode that matches the induced signal is determined as the print recognition mode.

Optionally, the touch recognition mode includes a press instruction recognition mode. When the processor 802 of the present embodiment executes the computer program 8011, the following steps may be implemented: outputting a press instruction corresponding to the pressure level of the induced signal when the touch recognition mode that matches the induced signal is determined as the press instruction recognition mode.

It is to be understood that the memory 801 in this embodiment may be either of a volatile memory and a non-volatile memory, or include both of them. The non-volatile memory may be a read-only memory (ROM), a programmable read-only memory (PROM), an erasable programmable read-only memory (Erasable PROM, EPROM), or an electrically erasable programmable read-only memory (Electrically EPROM, EEPROM) or a flash memory. The volatile memory can be a random access memory (RAM) that acts as an external cache. By way of illustrative but non-limiting explanation, many forms of RAM are available, such as a static random access memory (SRAM), a dynamic random access memory (DRAM), a synchronous dynamic random access memory (SDRAM), a double data rate synchronous dynamic random access memory (DDRS-DRAM), an enhanced synchronous dynamic random access memory (ESDRAM), a synchronous link dynamic random access memory (SLDRAM)) and a direct rambus random access memory (DRRAM). The memory 801 of the wireless link monitoring method described herein is intended to comprise, without being limited to, these and any other suitable types of memories.

Furthermore, an embodiment of the present disclosure further provides a computer-readable storage medium having stored thereon a computer program. When the computer program is executed by a processor, the following steps are implemented: inputting a detection signal to the first electrodes; receiving an induced signal from the second electrodes; determining a pressure level of the induced signal; and determining a touch recognition mode that matches the induced signal from pre-stored correspondences between pressure levels and touch recognition modes based on the pressure level of the induced signal.

Optionally, the computer program of this embodiment when executed by the processor to determine the pressure level of the induced signal includes: determining the pressure level matching the induced signal from pre-stored correspondences between electrical parameters and pressure levels based on an electrical parameter of the induced signal.

Optionally, the touch recognition mode includes a print recognition mode. When the computer program of the present embodiment is executed by the processor, the following step may be performed: extracting, from the induced signal, a feature to be recognized for detecting a biological print when the touch recognition mode that matches the induced signal is determined as the print recognition mode.

Optionally, the touch recognition mode includes a press instruction recognition mode. When the computer program is executed by the processor, the following step may be performed: outputting a press instruction corresponding to a press level of the induced signal when the touch recognition mode that matches the induced signal is determined as the press instruction recognition mode.

In the embodiments of the methods of the present disclosure, sequential numbers of the described steps cannot be used to define the sequence of the steps. For those skilled in the art, changes in the sequence of the steps made without any creative work also fall within the protection scope of the present disclosure.

Unless otherwise defined, technical or scientific terms used herein should have the same meaning as commonly understood by those having ordinary skills in the art to which the present disclosure pertains. Terms such as "first" and "second" used herein are used merely to distinguish different constituent components rather than to indicate any sequence, number or importance. The terms "comprising", "including" or other variants thereof are intended to means that the element or item stated before such terms encompasses elements, items and equivalents thereof listed after these terms without excluding other elements or items not expressly listed. The terms "connect", "connected" or the like are not intended to define physical or mechanical connection, but may include an electrical connection, either direct or indirect. Such words as "up", "down", "left" and "right" are merely used to represent a relative positional relationship, and when an absolute position of the described object is changed, the relative position relationship will be changed accordingly.

It will be understood that when an element such as a layer, a film, an region or a substrate is referred to as being "on" or "under" another element, it can be directly "on" or "under" the other element, or intervening elements may be present.

The above are optional embodiments of the present disclosure, and it should be noted that several improvements and modifications can be made by those skilled in the art without departing from the principle of the present disclosure, which improvements and modifications should also be deemed as falling within the scope of protection of the present disclosure.

What is claimed is:

1. A feature recognition structure comprising:
a plurality of first electrodes and a plurality of second electrodes disposed on a base substrate, wherein orthogonal projections of the plurality of first electrodes and of the plurality of second electrodes on the base substrate intersect each other to form a plurality of overlap regions; and
a plurality of functional patterns disposed between one or more of the plurality of first electrodes and corresponding one or more of the plurality of second electrodes, wherein an orthogonal projection of each of the plurality of functional patterns on the base substrate is located in a corresponding one of the plurality of overlap regions,
wherein the functional patterns comprise at least one piezoelectric material, and have at least two types of sub-patterns, and different types of the sub-patterns have substantially different piezoelectric coefficients, wherein
the functional patterns comprise at least one first type functional pattern and at least one second type functional pattern which is spaced apart from the at least one first type functional pattern; and
at least one orthogonal projection of at least one of the first type functional patterns on the base substrate and at least one orthogonal projection of at least one of the second type functional patterns on the base substrate are located in a same overlap region.

2. The feature recognition structure according to claim 1, wherein
the at least one orthogonal projection of the at least one first type functional pattern on the base substrate and the at least one orthogonal projection of the at least one second type functional pattern on the base substrate fall within a same overlap region, but are separated from each other.

3. The feature recognition structure according to claim 1, wherein
the first type functional pattern comprises zinc oxide (ZnO), and the second type functional pattern comprises gallium nitride (GaN).

4. The feature recognition structure according to claim 3, wherein
the material of zinc oxide has a piezoelectric coefficient of 1.21 $C/m^2$, and the material of gallium nitride has a piezoelectric coefficient of 0.73 $C/m^2$.

5. The feature recognition structure according to claim 1, wherein
at least two adjacent first electrodes are connected in parallel with each other, and at least two adjacent second electrodes are connected in parallel with each other.

6. The feature recognition structure according to claim 1, wherein
a display region on the base substrate is divided into a plurality of independent detection sub-regions;
in each of the detection sub-regions, the first electrodes are connected in parallel with each other, and the second electrodes are also connected in parallel with each other; and
the first electrodes between different detection sub-regions are not electrically connected, and the second electrodes between the different detection sub-regions are not electrically connected.

7. A feature recognition device comprising:
a feature recognition structure according to claim 1;
an input circuit configured to input a detection signal to the first electrodes;
a reception circuit configured to receive an induced signal from the second electrodes;
a storage circuit configured to store correspondences between pressure levels and touch recognition modes;
a determination circuit configured to determine a pressure level of the induced signal; and
a processing circuit configured to determine a touch recognition mode that matches the induced signal from correspondences between pressure levels and touch recognition modes based on the pressure level.

8. The feature recognition device according to claim 7, wherein
the storage circuit further stores correspondences between the induced signals and the pressure levels; and
the determination circuit is specifically configured to determine the pressure level matching the induced signal from the correspondences between the induced signals and the pressure levels stored by the storage circuit based on an electrical parameter of the induced signal.

9. The feature recognition device according to claim 8, wherein
the correspondences between the induced signals and the pressure levels stored by the storage circuit comprise:
a first table showing correspondences between pressures $N_1$ received by the first piezoelectric material comprised in the first functional patterns of the plurality of functional patterns and induced currents $I_1$ that can be generated by the first piezoelectric material;
a second table showing correspondences between pressures $N_2$ received by the second piezoelectric material comprised in the second functional patterns of the plurality of functional patterns and induced currents $I_2$ that can be generated by the second piezoelectric material; and
a third table showing correspondences between pressures N received by the first piezoelectric material and the second piezoelectric material simultaneously and induced currents $I(I_1+I_2)$ that can be generated by the first piezoelectric material and the second piezoelectric material.

10. The feature recognition device according to claim 7, wherein
the touch recognition mode comprises a print recognition mode; and
the feature recognition device further comprises:
a first execution circuit configured to extract, from the induced signal, a feature to be recognized for detecting a biological print when the processing circuit determines that the touch recognition mode matching the induced signal is the print recognition mode.

11. The feature recognition device according to claim 7, wherein
the touch recognition mode comprises a press instruction recognition mode; and
the feature recognition device further comprises:
a second execution circuit, configured to output a press instruction corresponding to the press level of the induced signal when the processing circuit determines that the touch recognition mode matching the induced signal is the press instruction recognition mode.

12. A display device comprising the feature recognition device according to claim 7.

13. A driving method applied to the feature recognition structure according to claim 1, comprising:
inputting a detection signal to the first electrodes;
receiving an induced signal from the second electrodes;
determining a pressure level of the induced signal; and
determining a touch recognition mode that matches the induced signal from pre-stored correspondences between pressure levels and touch recognition modes based on the pressure level of the induced signal.

14. The driving method according to claim 13, wherein the determining the pressure level of the induced signal comprises:
determining the pressure level that matches the induced signal from pre-stored correspondences between electrical parameters and pressure levels based on the electrical parameter of the induced signal.

15. The driving method according to claim 13, wherein the touch recognition mode comprises a print recognition mode; and the driving method further comprises:
extracting, from the induced signal, a feature to be recognized for detecting a biological print when the touch recognition mode that matches the induced signal is determined as the print recognition mode.

16. The driving method according to claim 13, wherein the touch recognition mode comprises a press instruction recognition mode; and the driving method further comprises:
outputting a press instruction corresponding to the press level of the induced signal when the touch recognition mode that matches the induced signal is determined as the press instruction recognition mode.

17. A method for fabricating a feature recognition structure, comprising:
providing a base substrate; and
forming a plurality of first touch electrodes, a plurality of piezoelectric patterns, and a plurality of second touch electrodes sequentially on the base substrate,
wherein orthogonal projections of the plurality of first electrodes and of the plurality of second electrodes on the base substrate intersect each other to form a plurality of overlap regions; the plurality of functional patterns is disposed between one or more of the plurality of first electrodes and corresponding one or more of the plurality of second electrodes, and orthogonal projections of the plurality of functional patterns on the base substrate are located in the plurality of overlap regions; and the functional patterns comprise at least one piezoelectric material, and has at least two types of sub-patterns, and different types of the sub-patterns have substantially different piezoelectric coefficients,
wherein
the functional patterns comprise at least one first type functional pattern and at least one second type functional pattern which is spaced apart from the at least one first type functional pattern; and
at least one orthogonal projection of at least one of the first type functional patterns on the base substrate and at least one orthogonal projection of at least one of the second type functional patterns on the base substrate are located in a same overlap region.

18. A feature recognition structure comprising:
a plurality of first electrodes and a plurality of second electrodes disposed on a base substrate, wherein orthogonal projections of the plurality of first electrodes and of the plurality of second electrodes on the base substrate intersect each other to form a plurality of overlap regions; and
a plurality of functional patterns disposed between one or more of the plurality of first electrodes and corresponding one or more of the plurality of second electrodes, wherein an orthogonal projection of each of the plurality of functional patterns on the base substrate is located in a corresponding one of the plurality of overlap regions,
wherein the functional patterns comprise at least one piezoelectric material, and have at least two types of sub-patterns, and different types of the sub-patterns have substantially different piezoelectric coefficients,
wherein
the functional patterns comprise at least one first type functional patterns and at least one second type functional patterns; and
of two adjacent overlap regions, one comprises only the orthogonal projection of the first type functional pattern on the base substrate, and the other comprises only the orthogonal projection of the second type functional pattern on the base substrate.

19. The feature recognition structure according to claim 18, wherein
the first electrode extends in a first direction, and the plurality of the first electrodes are disposed in parallel with each other in a second direction; and
of two adjacent overlap regions in the first direction, one comprises only the orthogonal projection of the first type functional pattern on the base substrate, and the other comprises only the orthogonal projection of the second type functional pattern on the base substrate.

* * * * *